US008860919B2

(12) United States Patent
Chung et al.

(10) Patent No.: US 8,860,919 B2
(45) Date of Patent: Oct. 14, 2014

(54) DISPLAY APPARATUS AND METHOD OF MANUFACTURING DISPLAY APPARATUS

(75) Inventors: Yun-Ah Chung, Yongin (KR); Jong-Hyuk Lee, Yongin (KR); Seung-Young Song, Yongin (KR); Yoon-Hyeung Cho, Yongin (KR); Min-Ho Oh, Yongin (KR); Byoung-Duk Lee, Yongin (KR); So-Young Lee, Yongin (KR); Yong-Tak Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 232 days.

(21) Appl. No.: 13/244,132

(22) Filed: Sep. 23, 2011

(65) Prior Publication Data

US 2012/0154717 A1  Jun. 21, 2012

(30) Foreign Application Priority Data

Dec. 15, 2010  (KR) .................... 10-2010-0128618

(51) Int. Cl.
| | |
|---|---|
| *G02F 1/1339* | (2006.01) |
| *G02F 1/13* | (2006.01) |
| *H01J 63/04* | (2006.01) |
| *H01J 9/26* | (2006.01) |
| *H01J 9/32* | (2006.01) |
| *H01J 1/62* | (2006.01) |
| *H01L 51/52* | (2006.01) |
| *H01L 27/32* | (2006.01) |

(52) U.S. Cl.
CPC ......... H01L 51/5246 (2013.01); *H01L 27/3244* (2013.01)
USPC .............. 349/153; 349/192; 313/512; 445/25

(58) Field of Classification Search
USPC ...................... 349/153, 192; 313/512; 445/25
See application file for complete search history.

(56) References Cited

U.S. PATENT DOCUMENTS

| | | | |
|---|---|---|---|
| 2002/0068143 A1* | 6/2002 | Silvernail et al. ............... | 428/76 |
| 2002/0111434 A1* | 8/2002 | White et al. .................. | 525/242 |

(Continued)

FOREIGN PATENT DOCUMENTS

| | | | |
|---|---|---|---|
| JP | 2006004781 A | * | 1/2006 |
| JP | 2008-270415 A | | 11/2008 |

(Continued)

OTHER PUBLICATIONS

Tohoku Pioneer Corp., Organic EL Element and Organic EL Display Panel, Jan. 5, 2006, Machine Translation of JP 2006-004781 A from Patent Abstracts of Japan website, All Pages.*

*Primary Examiner* — Edward J. Glick
*Assistant Examiner* — Dennis Y Kim
(74) *Attorney, Agent, or Firm* — Knobbe Martens Olson & Bear LLP (57) ABSTRACT

In order to improve durability, a display apparatus includes a substrate; an encapsulation substrate facing the substrate; a display unit disposed between the substrate and the encapsulation substrate; a sealing unit disposed between the substrate and the encapsulation substrate so as to bond the substrate and the encapsulation substrate and spaced from the display unit; and a protective member formed over at least one surface among surfaces of the substrate and the encapsulation substrate, except surfaces facing the display unit. The protective member includes a base, a plurality of capsules comprising monomers, and a catalyst inducing polymerization of the monomers.

20 Claims, 5 Drawing Sheets

(56) References Cited

U.S. PATENT DOCUMENTS

| | | |
|---|---|---|
| 2003/0002008 A1 | 1/2003 | Inoue et al. |
| 2003/0080677 A1 | 5/2003 | Mikhael et al. |
| 2005/0148739 A1 | 7/2005 | Hara et al. |
| 2007/0170861 A1* | 7/2007 | Lee et al. ................ 313/512 |
| 2008/0054796 A1* | 3/2008 | Sung et al. .............. 313/504 |
| 2010/0102719 A1* | 4/2010 | Lee et al. ................ 313/512 |
| 2010/0168280 A1* | 7/2010 | Guadagno et al. ....... 523/464 |
| 2011/0217619 A1* | 9/2011 | Yoshie et al. ............ 429/482 |

FOREIGN PATENT DOCUMENTS

| | | |
|---|---|---|
| KR | 10-2000-0048197 A | 7/2000 |
| KR | 10-2004-0088049 A | 10/2004 |
| KR | 10-2008-0097874 A | 11/2008 |
| KR | 10-2009-0071162 A | 7/2009 |

* cited by examiner

DISPLAY APPARATUS AND METHOD OF MANUFACTURING DISPLAY APPARATUS

CROSS-REFERENCE TO RELATED PATENT APPLICATION

This application claims the benefit of Korean Patent Application No. 10-2010-0128618, filed on Dec. 15, 2010, in the Korean Intellectual Property Office, the disclosure of which is incorporated herein in its entirety by reference.

BACKGROUND

1. Field

The present disclosure relates to a display apparatus and a method of manufacturing the display apparatus, and more particularly, to a display apparatus and a method of manufacturing the display apparatus having improved durability.

2. Description of the Related Art

Recently, display apparatuses have been replaced with portable thin flat panel display apparatuses. In particular, thin flat panel display apparatuses including an organic light emitting display apparatus and a liquid crystal display (LCD) apparatus have been highlighted for their excellent image qualities.

In general, a flat panel display apparatus has a structure in which a display unit is disposed between a substrate and an encapsulation substrate, and the substrate and the encapsulation substrate are bonded by using a sealing unit.

The substrate and the encapsulation substrate may be damaged by impact and have defects such as scratches, holes, cracks or the like during the manufacturing process or use of the flat panel display apparatus. Thus, there is limit in improving durability of a display apparatus.

SUMMARY

One aspect of the present invention provides a display apparatus and a method of manufacturing the display apparatus so as to easily improve durability of the display apparatus.

According to an aspect of the present invention, there is provided a display apparatus including a substrate; an encapsulation substrate facing the substrate; a display unit disposed between the substrate and the encapsulation substrate; a sealing unit disposed between the substrate and the encapsulation substrate so as to bond the substrate and the encapsulation substrate and spaced from the display unit; and a protective member formed over at least one surface among surfaces of the substrate and the encapsulation substrate except surfaces facing the display unit, and the protective member comprising a base, a plurality of capsules comprising monomers, and a catalyst inducing polymerization of the monomers.

The protective member may be formed of a mixture of the base, the plurality of capsules, and the catalyst.

The plurality of capsules may include coating layers covering surfaces of the monomers, respectively.

Each of the coating layers may be formed of a polymer material.

The base may include a resin.

Each of the monomers may include a material selected from the group consisting of dicyclopentadiene, hydroxyl terminated polydimethylsiloxane, and polydiethylsiloxane.

The catalyst may include a Grubbs catalyst.

The protective member may include a region including epoxy resin which is formed by the polymerization of the monomers.

The display unit may include an organic light emitting device or a liquid crystal device.

According to another aspect of the present invention, there is provided a method of manufacturing a display apparatus, the method including the operations of disposing a display unit between a substrate and an encapsulation substrate facing the substrate, and bonding the substrate and the encapsulation substrate by using a sealing unit; and forming a protective member over at least one surface among surfaces of the substrate and the encapsulation substrate except surfaces facing the display unit, and the protective member comprising a base, a plurality of capsules comprising monomers, and a catalyst inducing polymerization of the monomers.

The protective member may be formed by mixing the base, the plurality of capsules, and the catalyst.

The plurality of capsules may include coating layers covering surfaces of the monomers, respectively.

Each of the coating layers may be formed of a polymer material.

The base may include a resin.

Each of the monomers may include a material selected from the group consisting of dicyclopentadiene, hydroxyl terminated polydimethylsiloxane, and polydiethylsiloxane.

The catalyst may include a Grubbs catalyst.

The protective member may include a region including epoxy resin, which is formed by the polymerization of the monomers.

The display unit may include an organic light emitting device or a liquid crystal device.

The protective member may be formed over a predetermined area of at least one side surface among side surfaces of the substrate and side surfaces of the encapsulation substrate.

The protective member may be formed over a predetermined area of surfaces opposite the surfaces of the substrate and the encapsulation substrate which face the display unit.

BRIEF DESCRIPTION OF THE DRAWINGS

The above and other features and advantages of the present invention will become more apparent by describing in detail embodiments thereof with reference to the attached drawings in which.

DETAILED DESCRIPTION OF EMBODIMENTS

Hereinafter, embodiments of the present invention will be described in detail with reference to the attached drawings.

Figure 1:
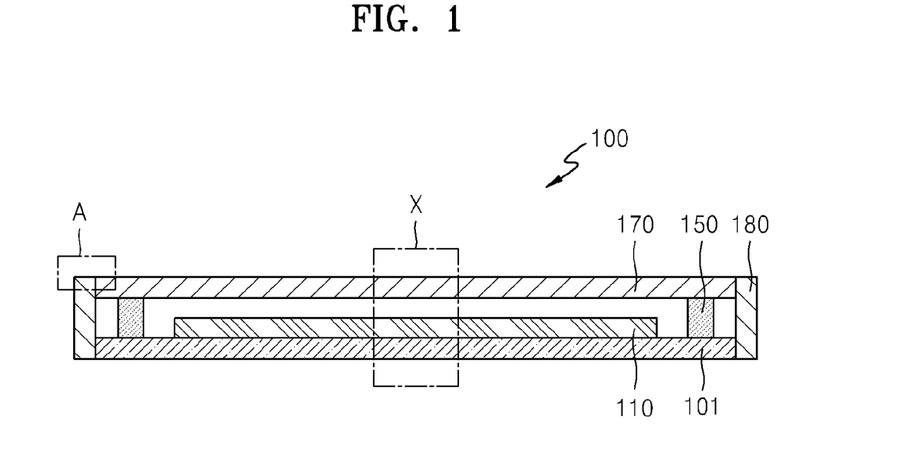
FIG. 1 is a cross-sectional view of a display apparatus according to an embodiment of the present invention.
Figure 2:
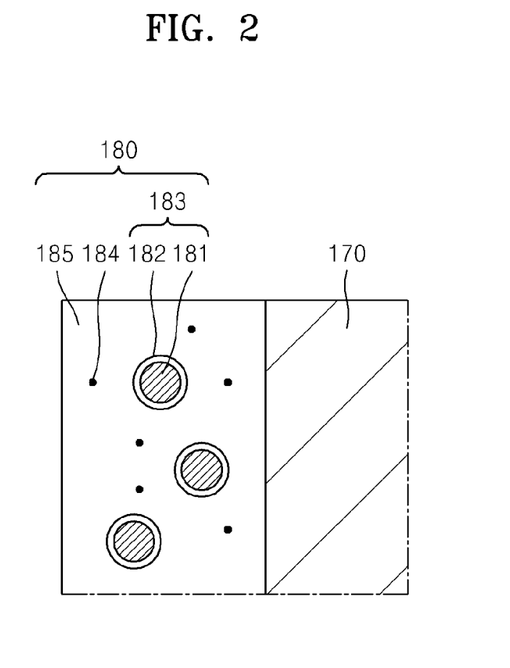
FIG. 2 is a magnified view of a portion A in the display apparatus of FIG. 1.
Figure 3:
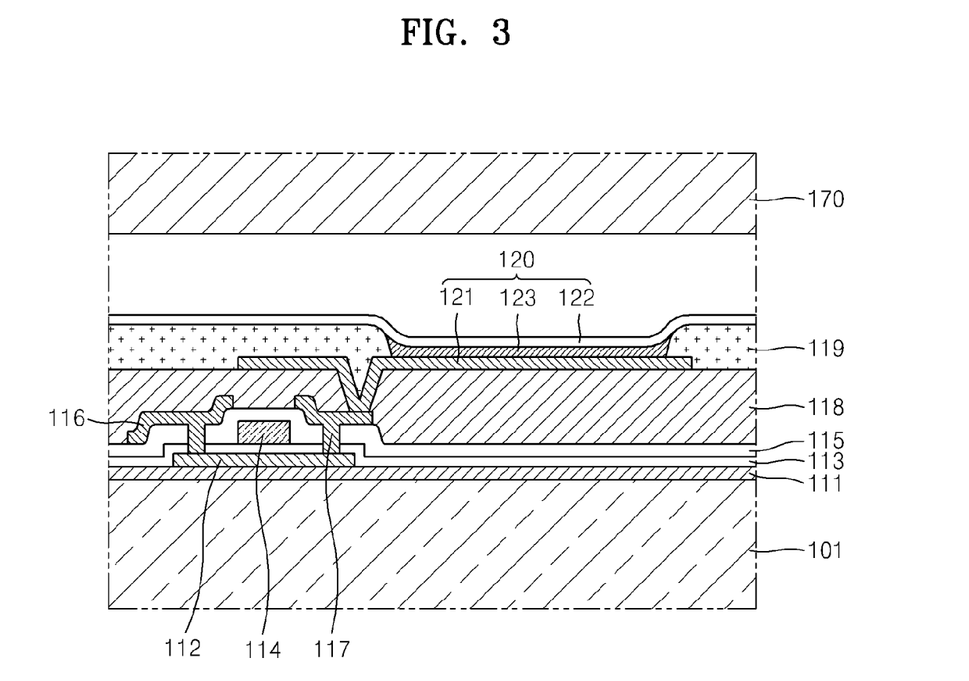
FIG. 3 is a magnified view of a portion X in the display apparatus of FIG. 1.

FIG. 1 is a cross-sectional view of a display apparatus 100 according to an embodiment of the present invention. FIG. 2 is a magnified view of a portion A in the display apparatus 100 of FIG. 1. FIG. 3 is a magnified view of a portion X in the display apparatus 100 of FIG. 1.

Referring to FIG. 1, the display apparatus 100 includes a substrate 101, a display unit 110, an encapsulation substrate 170, a sealing unit 150, and a protective member 180. Hereinafter, the aforementioned members will be described in detail.

The substrate 101 may be formed of transparent glass containing $SiO_2$ as a main component, but is not limited thereto. In another example, the substrate 101 may also be formed of a transparent plastic material that may be an insulating organic material selected from the group consisting of polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

The display unit 110 is disposed on the substrate 101. The type of the display unit 110 may vary. According to the present embodiment, the display unit 110 includes an organic light emitting device, but the display unit 110 is not limited thereto. In another embodiment, the display unit may include a liquid crystal device.

The encapsulation substrate 170 is disposed to face the display unit 110. The substrate 101 and the encapsulation substrate 170 are bonded by using the sealing unit 150. The sealing unit 150 is formed around the display unit 110 without contacting the display unit 110.

The encapsulation substrate 170 protects the display unit 110 from external moisture or oxygen. The encapsulation substrate 170 may be formed by using various materials, and in particular, may be formed of a glass material or a plastic material.

The protective member 180 is disposed on side surfaces of the substrate 101 and the encapsulation substrate 170. The protective member 180, as a self-repairing structure, includes a base 185, a plurality of capsules 183, and a catalyst 184. Each of the capsules 183 has one or more monomers 181 and a coating layer 182 covering the one or more monomers 181.

Each monomer 181 includes a material which becomes an epoxy-based resin by polymerization. In more detail, the monomer 181 includes a material selected from the group consisting of dicyclopentadiene, hydroxyl terminated polydimethylsiloxane, and polydiethylsiloxane.

The coating layer 182 covering the monomer 181 is formed of a polymer material. In particular, the coating layer 182 may include a thermosetting polymer material. The coating layer 182 is formed to have an appropriate thickness and appropriate strength so as to burst under a pressure equal to or greater than a predetermined level.

The catalyst 184 is included in the protective member 180 so as to facilitate polymerization of the monomers 181, and in particular, the catalyst 184 includes a Grubbs catalyst.

An example of the catalyst 184 may include benzylidenebis(tricyclohexylphosphine)dichlororuthenium.

The base 185 may include a resin. In particular, the base 185 may include an epoxy resin.

When a shock or impact is applied to a side surface of the display apparatus 100, the shock is first delivered to the protective member 180. Also, a shock equal to or greater than a predetermined level is applied to a side surface of the display apparatus 100, small cracks, holes, or scratches are incurred on the side surface of the display apparatus 100 or on a side surface of the encapsulation substrate 170.

Due to the shock applied to the display apparatus 100, the coating layer 182 of each capsule 183 of the protective member 180 bursts. Also, when defects such as cracks, holes, or scratches on a surface of the substrate 101 or a surface of the encapsulation substrate 170 caused by the shock applied to the display apparatus 100 contact the capsule 183, the coating layer 182 may burst.

When the coating layer 182 bursts, the monomer 181 flows therefrom. The flown monomers 181 form a region including polymer. In particular, the flown monomers 181 form a portion of epoxy resin (not shown) by polymerization. Also, the catalyst 184 disposed around the monomers 181 facilitates the monomers 181 such that a portion of epoxy resin is formed by inducing the polymerization of the monomers 181 in a room temperature.

The epoxy resin formed by the polymerization of the monomers 181 fills the defects such as cracks, holes, or scratches that are incurred on the side surface of the substrate 101 or the side surface of the encapsulation substrate 170. Thus, it is possible to repair the defects incurred on a surface of the display apparatus 100 without any additional process.

In one or more embodiments, the display unit 110 may vary. In the present embodiment, an organic light emitting device may be formed as the display unit 110.

Referring to FIG. 3, a buffer layer 111 is formed on the substrate 101. The buffer layer 111 provides a flat surface on the substrate 101, and prevents moisture and foreign substances from entering toward the substrate 101.

An active layer 112 having a predetermined pattern is formed on the buffer layer 111. The active layer 112 may be formed of an inorganic semiconductor such as amorphous silicon or poly silicon, or formed of an organic semiconductor, and may include a source region, a drain region, and a channel region.

The source and drain regions may be formed by doping the active layer 112 that is formed of amorphous silicon or poly silicon with impurities. By being doped with boron (B) that is a group III element, a p-type semiconductor may be formed, and by being doped with nitrogen (N) that is a group V element, an n-type semiconductor may be formed.

A gate insulating layer 113 is formed on the active layer 112, and a gate electrode 114 is formed on a predetermined region of the gate insulating layer 113. The gate insulating layer 113 functions to insulate the active layer 112 from the gate electrode 114, and may be formed of an organic material or an inorganic material including SiNx or $SiO_2$. The gate electrode 114 may be formed of a metal selected from the group consisting of Au, Ag, Cu, Ni, Pt, Pd, Al, and Mo. In another embodiment, the gate electrode 114 may be formed of a metal alloy such as Al—Nd alloy, Mo—W alloy, and the like but is not limited thereto. In other embodiments, the gate electrode 114 may be formed by using various materials in consideration of adhesion, planarization, electrical resistance, formability, or the like. The gate electrode 114 is connected to a gate line (not shown) for applying an electrical signal.

An interlayer insulating layer 115 is formed on the gate electrode 114. The interlayer insulating layer 115 and the gate insulating layer 113 are formed in such a manner that the source and drain regions of the active layer 112 are exposed, and a source electrode 116 and a drain electrode 117 contact the exposed source and drain regions of the active layer 112.

The source and drain electrodes 116 and 117 may be formed of a metal selected from the group consisting of Au, Pd, Pt, Ni, Rh, Ru, Ir and Os. In another embodiment, the source and drain electrodes 116 and 117 may be formed of a metal alloy containing at least two metals from the group consisting of Al, Mo, Al—Nd alloy, and Mo—W alloy but is not limited thereto.

A passivation layer 118 is formed to cover the source electrode 116 and the drain electrode 117. For the passivation layer 118, an inorganic insulating layer and/or an organic insulating layer may be used. The inorganic insulating layer may include $SiO_2$, SiNx, SiON, $Al_2O_3$, $TiO_2$, $Ta_2O_5$, $HfO_2$, ZrO$_2$, BST, or PZT, and the organic insulating layer may include polymer derivatives having commercial polymers (PMMA and PS) and a phenol group, an acryl-based polymer, an imide-based polymer, an allyl ether-based polymer, an amide-based polymer, a fluorine-based polymer, a p-xylene-based polymer, a vinylalcohol-based polymer, or a combination thereof. The passivation layer 118 may be formed as a multi-stack including the inorganic insulating layer and the organic insulating layer.

The passivation layer 118 is formed to expose the drain electrode 117, and an organic light emitting device 120 is formed to be connected to the exposed drain electrode 117. The organic light emitting device 120 includes a first electrode 121, a second electrode 122, and an intermediate layer 123. In more detail, the first electrode 121 and the drain electrode 117 contact each other.

The intermediate layer 123 includes an organic light emitting layer (not shown), and emits visible light when a voltage is applied thereto via the first electrode 121 and the second electrode 122.

A pixel defining layer (PDL) 119 that is formed of an insulating material is arranged on the first electrode 121.

A predetermined opening is formed on the PDL 119 so as to expose the first electrode 121. The intermediate layer 123 is formed on the exposed first electrode 121. Afterward, the second electrode 122 is formed to be connected to the intermediate layer 123.

The first electrode 121 and the second electrode 122 have polarities of an anode electrode and a cathode electrode, respectively. In an alternative embodiment, the polarities of the first electrode 121 and the second electrode 122 may be reversed.

The encapsulation substrate 170 is disposed on the second electrode 122.

The display apparatus 100 according to the present embodiment includes the protective member 180. The protective member 180 includes the monomers 181 covered by the coating layers 182. When an external shock is applied to the display apparatus 100, defects such as cracks, holes, or scratches may be incurred on the side surface of the substrate 101 or the side surface of the encapsulation substrate 170, and the epoxy resin portion is formed by the polymerization of the monomers 181 and fills the defects.

By doing so, defects incurred during the use of the display apparatus 100 can be immediately and naturally repaired without any additional efforts. Also, when the display apparatus 100 is transported, stored and inspected during the manufacture of the display apparatus 100, defects such as cracks, holes, or scratches may be incurred on the side surface of the substrate 101 or the side surface of the encapsulation substrate 170. In this case, the region including epoxy resin is formed by the polymerization of the monomers 181 and fills the defects so that the defects may be immediately and naturally repaired.

As a result, the display apparatus 100 having significantly improved durability may be easily embodied.

Figure 4:
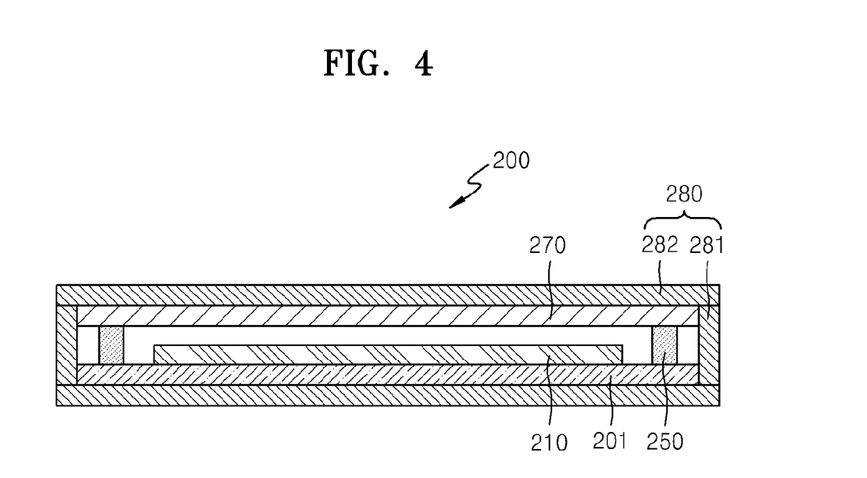
FIG. 4 is a cross-sectional view of a display apparatus according to another embodiment of the present invention.

FIG. 4 is a cross-sectional view of a display apparatus 200 according to another embodiment of the present invention. For convenience of description, differences between the present embodiment and the previous embodiment will be described.

Referring to FIG. 4, the display apparatus 200 includes a substrate 201, a display unit 210, an encapsulation substrate 270, a sealing unit 250, and a protective member 280. The protective member 280 includes a first part 281 and a second part 282.

The display unit 210 is disposed on the substrate 201. The encapsulation substrate 270 is disposed to face the display unit 210. The substrate 201 and the encapsulation substrate 270 are bonded by using the sealing unit 250. The sealing unit 250 is formed around the display unit 210 without contacting the display unit 210.

The first part 281 of the protective member 280 is disposed on side surfaces of the substrate 201 and the encapsulation substrate 270. The second part 282 of the protective member 280 is disposed on a bottom surface of the substrate 201 and a top surface of the encapsulation substrate 270, wherein the bottom surface is the opposite surface of a surface whereon the display unit 210 is formed, and the top surface is the opposite surface of a surface facing the display unit 210.

The first part 281 and second part 282 of the protective member 280 are formed of the same material and have the same structure as the protective member 180 of the previous embodiment. Thus, detailed descriptions thereof are omitted here.

The display apparatus 200 according to the present embodiment includes the protective member 280. The protective member 280 includes monomers (not shown) covered by coating layers (not shown). When an external shock is applied to the display apparatus 200, defects such as cracks, holes, or scratches may be incurred on an exterior surface of the substrate 201 or an exterior surface of the encapsulation substrate 270, and then, a region including epoxy resin is formed by polymerization of the monomers and fills the defects.

By doing so, defects incurred during the use of the display apparatus 200 can be immediately and naturally repaired without any additional efforts. Also, when the display apparatus 200 is transported, stored and inspected during the manufacture of the display apparatus 200, defects such as cracks, holes, or scratches may be incurred on the exterior surface of the substrate 201 or the exterior surface of the encapsulation substrate 270. In this case, the region including epoxy resin is formed by the polymerization of the monomers and fills the defects so that the defects may be immediately and naturally repaired.

As a result, the display apparatus 200 having significantly improved durability may be easily embodied.

FIGS. 5A through 5G are diagrams for describing a method of manufacturing a display apparatus 300, according to an embodiment of the present invention.

Figure 5A:
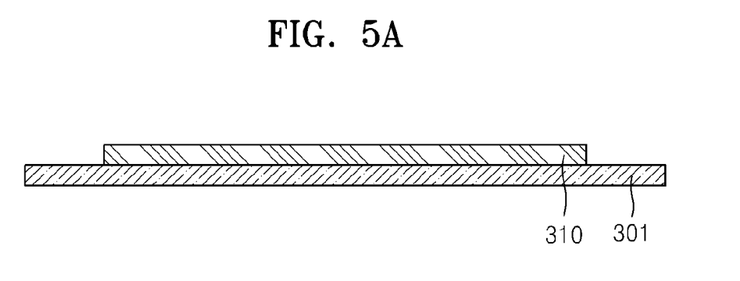
FIGS. 5A through 5G shows steps of a method of manufacturing a display apparatus according to an embodiment of the present invention.

Referring to FIG. 5A, a display unit 310 is formed on a substrate 301. A material for forming the substrate 301 is described above in the foregoing embodiments and a detailed description thereof is omitted here.

The display unit 310 is disposed on the substrate 301. The display unit 310 may vary. In some embodiments, the display unit 310 may include an organic light emitting device or a liquid crystal device.

Figure 5B:
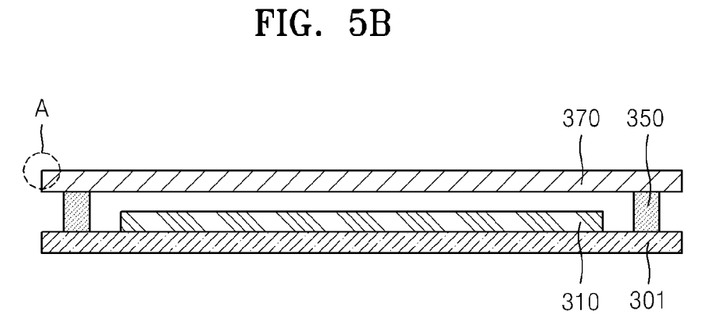

Referring to FIG. 5B, an encapsulation substrate 370 is disposed to face the display unit 310. The substrate 301 and the encapsulation substrate 370 are bonded by using a sealing unit 350. The sealing unit 350 is formed around the display unit 310 without contacting the display unit 310.

The encapsulation substrate 370 protects the display unit 310 from external moisture or oxygen. The encapsulation substrate 370 may be formed by using various materials, and in particular, may be formed of a glass material or a plastic material.

Figure 5C:
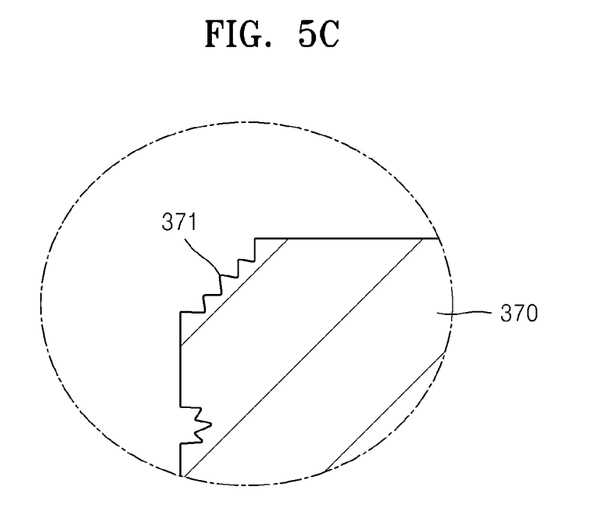

FIG. 5C is a magnified view of a portion A in FIG. 5B. Referring to FIG. 5C, a defect 371 such as a scratch is formed on an exterior surface of the encapsulation substrate 370. The defect 371 may be incurred while processes of FIGS. 5A and 5B are performed, when an unfinished display apparatus is transported for processes of FIGS. 5A and 5B, or when the unfinished display apparatus is transported, stored or inspected for subsequent processes after performing processes of FIGS. 5A and 5B.

Figure 5D:
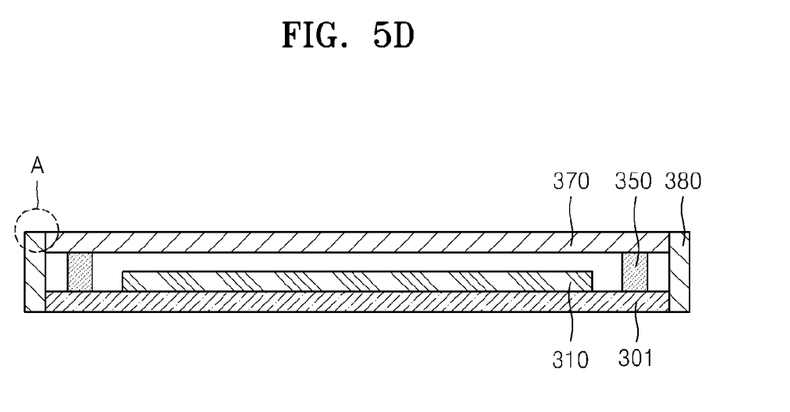
Figure 5E:
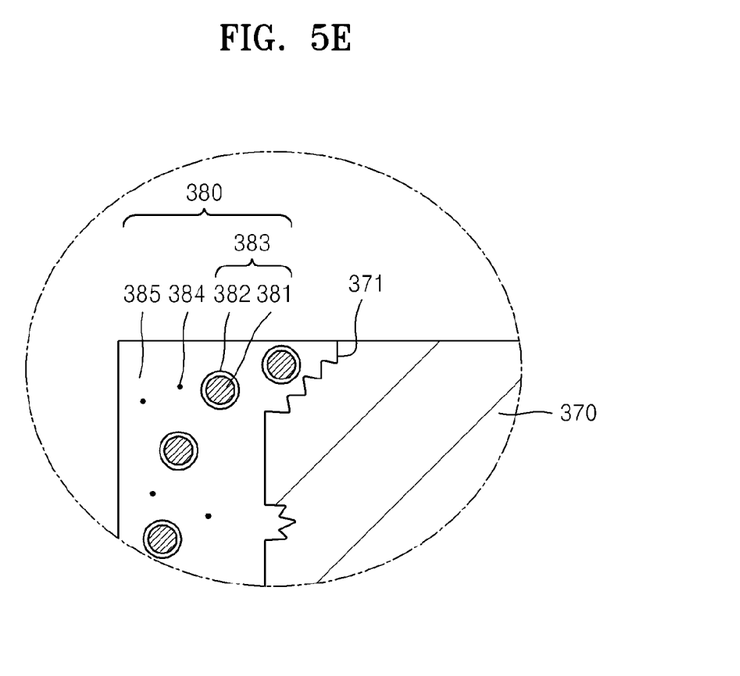

Afterward, referring to FIG. 5D, a protective member 380 is disposed on side surfaces of the substrate 301 and the encapsulation substrate 370. FIG. 5E is a magnified view of a portion A in FIG. 5D.

The protective member 380, as a self-repairing structure, includes a base 385, a plurality of capsules 383, and a catalyst 384. Each of the capsules 383 has one or more monomers 381 and a coating layer 382 covering the one or more monomers 381.

Each monomer 381 includes a material which becomes an epoxy-based resin by polymerization. In more detail, the monomer 381 includes a material selected from the group consisting of dicyclopentadiene, hydroxyl terminated polydimethylsiloxane, and polydiethylsiloxane.

The coating layer 382 covering the monomer 381 is formed of a polymer material. In particular, the coating layer 382 may include a thermosetting polymer material. The coating layer 382 has an appropriate thickness and appropriate strength so as to burst in response to a pressure equal to or greater than a predetermined level.

The catalyst 384 includes a Grubbs catalyst. In more detail, the catalyst 384 may include benzylidene-bis(tricyclohexylphosphine)dichlororuthenium.

The base 385 may include a resin, and in particular, the base 385 may include an epoxy resin.

Figure 5F:
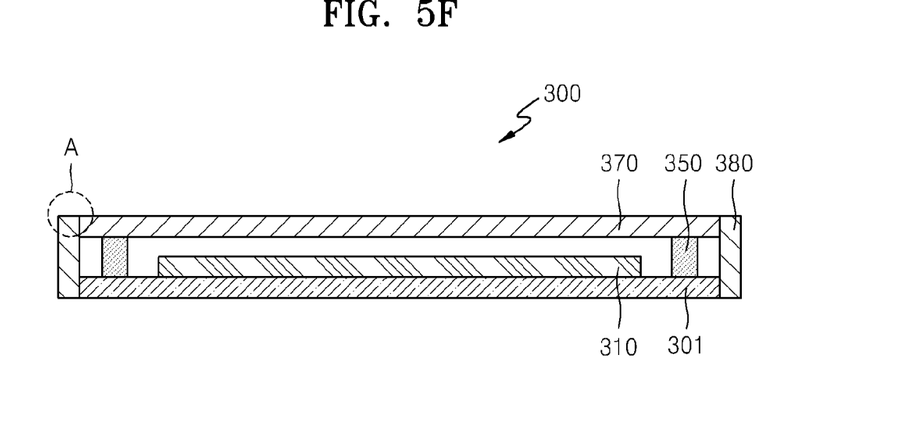
Figure 5G:
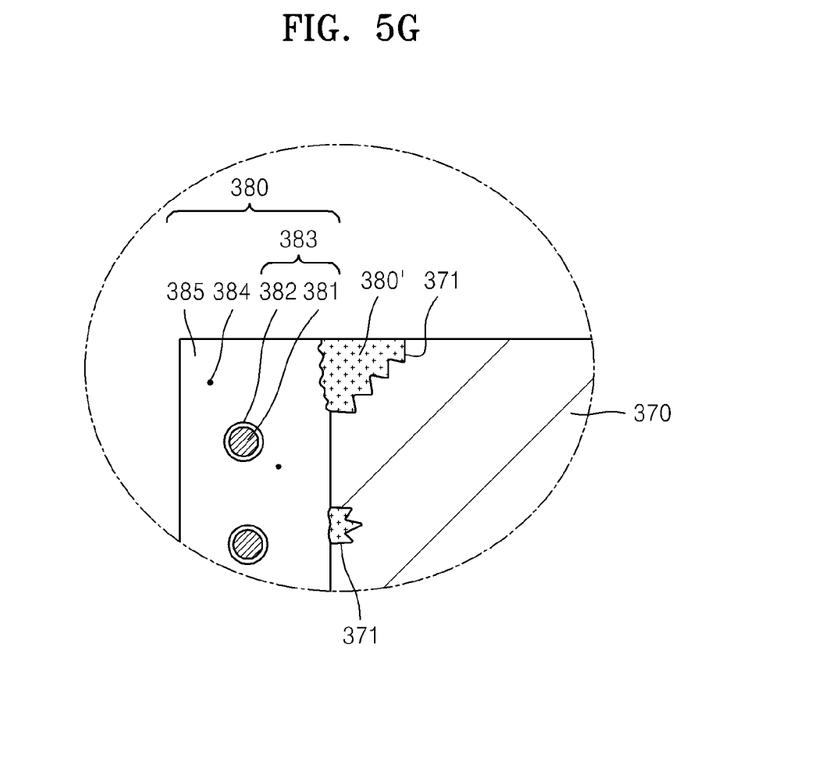

FIGS. 5F and 5G illustrate a final product of the display apparatus 300, defects of which are repaired by the protective member 380. FIG. 5G is a magnified view of a portion A in FIG. 5F.

When the coating layer 382 bursts due to a contact between the capsule 383 and the defect 371 that is incurred on the encapsulation substrate 370, the monomer 381 flows therefrom. The flown monomers 381 form a region including polymer, in particular, the flown monomers 381 form a region including epoxy resin 380' by polymerization. Also, the catalyst 384 disposed around the monomers 381 facilitates the monomers 381 to form the region including epoxy resin 380' by inducing the polymerization of the monomers 381 in a room temperature.

The region including epoxy resin 380' that is formed by the polymerization of the monomers 381 fills the defect 371 incurred on the exterior surface of the encapsulation substrate 370. Thus, it is possible to repair the defect 371 incurred on a surface of the display apparatus 300 without any additional process.

In the foregoing embodiment, the repair of defects formed before the protective member 380 is formed is discussed. But the invention is not limited thereto. That is, defects incurred after the protective member 380 is formed, e.g., defects that are incurred during use can be easily repaired by the protective member 380 so that durability of the display apparatus 300 is improved.

The display apparatus and the method of manufacturing the display apparatus according to the one or more embodiments may easily improve durability of the display apparatus.

While embodiments of the present invention has been particularly shown and described, it will be understood by those of ordinary skill in the art that various changes in form and details may be made therein without departing from the spirit and scope of the present invention as defined by the following claims.

What is claimed is:

1. A display apparatus comprising:
    a base substrate;
    an encapsulation substrate;
    a display array disposed between the base substrate and the encapsulation substrate;
    a sealing member surrounding the display array and disposed between the base substrate and the encapsulation substrate so as to bond the base substrate and the encapsulation substrate; and
    a protective member interconnecting the base substrate and the encapsulation substrate and separated from the sealing member with a gap therebetween, the protective member comprising a base material, a plurality of monomer-containing capsules and a catalyst for facilitating polymerization of the monomers once the monomers are released from the plurality of capsules.

2. The display apparatus of claim 1, wherein the protective member is a mixture of the base material, the plurality of capsules, and the catalyst.

3. The display apparatus of claim 1, wherein the plurality of capsules comprise coating layers enclosing the monomers.

4. The display apparatus of claim 3, wherein each of the coating layers is formed of a polymer material.

5. The display apparatus of claim 1, wherein the base material comprises a resin.

6. The display apparatus of claim 1, wherein each of the monomers comprises at least one material selected from the group consisting of dicyclopentadiene, hydroxyl terminated polydimethylsiloxane, and polydiethylsiloxane.

7. The display apparatus of claim 1, wherein the catalyst comprises a Grubbs catalyst.

8. The display apparatus of claim 1, wherein the protective member comprises a portion including an epoxy resin.

9. The display apparatus of claim 1, wherein the display array comprises an organic light emitting device or a liquid crystal device.

10. The display apparatus of claim 1, wherein the protective member is formed over a predetermined area of at least one side surface among side surfaces of the base substrate and side surfaces of the encapsulation substrate.

11. The display apparatus of claim 10, wherein the protective member is further formed over a major surface of at least one of the base substrate and the encapsulation substrate.

12. A method of manufacturing a display apparatus, the method comprising:
    disposing a display array between a base substrate and an encapsulation substrate;
    bonding the base substrate and the encapsulation substrate by placing a sealing member therebetween; and
    interconnecting the base substrate and the encapsulation substrate with a protective member such that the protective member is separated from the sealing member with therebetween, wherein the protective member comprises a base material, a plurality of monomer-containing capsules and a catalyst for facilitating polymerization of the monomers.

13. The method of claim 12, wherein the protective member is a mixture comprising the base material, the plurality of capsules, and the catalyst.

14. The method of claim 12, wherein the plurality of capsules comprises coating layers enclosing the monomers.

15. The method of claim 14, wherein each of the coating layers is formed of a polymer material.

16. The method of claim 12, wherein the base material comprises a resin.

17. The method of claim 12, wherein each of the monomers comprises at least one material selected from the group consisting of dicyclopentadiene, hydroxyl terminated polydimethylsiloxane, and polydiethylsiloxane.

18. The method of claim 12, wherein the catalyst comprises a Grubbs catalyst.

19. The method of claim 12, wherein the protective member comprises a portion including an epoxy resin.

20. The method of claim 12, wherein the display array comprises an organic light emitting device or a liquid crystal device.

* * * * *